United States Patent
Chan et al.

(10) Patent No.: US 11,307,641 B1
(45) Date of Patent: Apr. 19, 2022

(54) LOW POWER OPERATION METHOD FOR APPARATUS HAVING DATA TRANSMISSION RATE

(71) Applicants: Dyna Image Corporation, New Taipei (TW); Lite-On Semiconductor Corp., Taipei (TW)

(72) Inventors: Peng-Han Chan, New Taipei (TW); Chun-Hsien Lin, New Taipei (TW); Sheng-Cheng Lee, New Taipei (TW); Wen-Sheng Lin, New Taipei (TW); Yu-Cheng Su, New Taipei (TW)

(73) Assignees: Dyna Image Corporation, New Taipei (TW); Lite-On Semiconductor Corporation, Taipei (TW)

( * ) Notice: Subject to any disclaimer, the term of this patent is extended or adjusted under 35 U.S.C. 154(b) by 0 days.

(21) Appl. No.: 17/073,626

(22) Filed: Oct. 19, 2020

(51) Int. Cl.
G06F 1/00 (2006.01)
G06F 1/3287 (2019.01)
H03B 5/04 (2006.01)

(52) U.S. Cl.
CPC .......... G06F 1/3287 (2013.01); H03B 5/04 (2013.01)

(58) Field of Classification Search
CPC ................. G06F 1/3287; H03B 5/04
See application file for complete search history.

(56) References Cited

U.S. PATENT DOCUMENTS

| 5,550,489 | A * | 8/1996 | Raab | G06F 1/08 326/93 |
| 6,934,870 | B1 * | 8/2005 | Amos | G06F 1/04 713/501 |
| 2013/0290758 | A1 * | 10/2013 | Quick | G06F 1/324 713/323 |
| 2015/0089261 | A1 * | 3/2015 | Segawa | G06F 1/324 713/322 |

* cited by examiner

Primary Examiner — Nitin C Patel
(74) Attorney, Agent, or Firm — JCIPRNET

(57) ABSTRACT

A low power operation method provides an apparatus with a data transmission rate. A power management unit (PMU), which is not influenced by voltage, process, and temperature, biases a high frequency oscillator (HOSC) and makes the HOSC generate a steady and high precision clock. The clock of the HOSC is used to modify a timing length of a timer which is referenced by a low frequency oscillator (LOSC) without PMU. At last, through the modified timing length, the apparatus achieves high precision periods and data transmissions with compensation for voltage, process, and temperature. Thus, the data transmission cycles of the apparatus maintain stable and robust even if the apparatus applies duty cycle usage of the HOSC and the PMU for reducing power consumption with actions of turning on and turning off. Consequently, the periodic apparatus maintains data transmission rate with the low power consumption advantage of non-periodic apparatus.

6 Claims, 5 Drawing Sheets

(a)

(b)

LOW POWER OPERATION METHOD FOR APPARATUS HAVING DATA TRANSMISSION RATE

TECHNICAL FIELD OF THE INVENTION

The present invention relates to a low power operation method; more particularly, to using a power management unit (PMU) coordinated with a high-frequency oscillator (HOSC) for obtaining timing characteristics including stableness and robustness by, in an estimation way, transferring the timing characteristic of robustness of the HOSC to a timing length of a timer counted by another oscillator (e.g. a low-frequency oscillator (LOSC)), where, during sleeping, an apparatus maintains stable and robust periods via the modified timing length even if the HOSC and the PMU are closed.

DESCRIPTION OF THE RELATED ART

A device, such as a sensor, for generating data is usually operated in a periodic or non-periodic mode. For a periodic device, a stable and robust frequency oscillator is required to generate a clock for obtaining stable cycles. Therefore, the continuous biasing of the oscillator and the constant operation of a compensator are necessary, where an element for power management or compensation (e.g. low dropout regulator (LDO), bandgap . . . ) would not stop during sleeping. As shown in diagram (a) of FIG. 5, since the element for power management or compensation still works, a certain amount of current consumption occurs during sleeping as represented by the hatched portion. Consequently, the periodic device can not effectively reduce power consumption.

An event-driven operation mode is used for the non-periodic device, which closes the compensator and power during sleeping as shown in diagram (b) of FIG. 5. Yet, since self-awakening is not available, another driver is required to startup the device. Additional circuitry is required for triggering.

Hence, the prior art does not fulfill all users' requests on actual use.

SUMMARY OF THE INVENTION

The main purpose of the present invention is to use a PMU coordinated with a HOSC for obtaining timing characteristics including stableness and robustness by, in an estimation way, transferring the timing characteristic of robustness of the HOSC to a timing length of a timer counted by another oscillator (e.g. a low-frequency oscillator (LOSC)), where, during sleeping, an apparatus maintains stable and robust periods via the modified timing length even if the HOSC and the PMU are closed; and, as a result, the periodic apparatus maintains data transmission rate with the low power consumption advantage of non-periodic apparatus.

To achieve the above purpose, the present invention is a low power operation method for an apparatus having a data transmission rate, where the method is applied with a main apparatus, which comprises a first frequency oscillator (HOSC), a second frequency oscillator (LOSC), a power management unit (PMU), a timer, and a regulator; and where the method comprises steps of: (a) obtaining a base frequency of the main apparatus, where the base frequency is a known constant being a ratio of an ideal frequency of the first frequency oscillator to an ideal frequency of the second frequency oscillator; (b) turning on the PMU and the first frequency oscillator; (c) loading a data transmission rate, which is set by a user, to the timer as an initial timing length; then, in the regulator, calculating an actual period of the second frequency oscillator through the first frequency oscillator to obtain an actual frequency ratio, which is shifting and a ratio of an actual frequency of the first frequency oscillator to an actual frequency of the second frequency oscillator, as a real frequency; and, at last, through processing calculation with the regulator, multiplying a ratio of the base frequency to the real frequency by the initial timing length to obtain a valid timing length of the timer; (d) awaiting the main apparatus to enter into a sleeping mode; (e) turning off the PMU and the first frequency oscillator; and, (f) after the timer processes timing until reaching the valid timing length, turning back to step (b) to process a next cycle of step (b) to step (f) continuously. Accordingly, a novel low power operation method for an apparatus having a data transmission rate is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
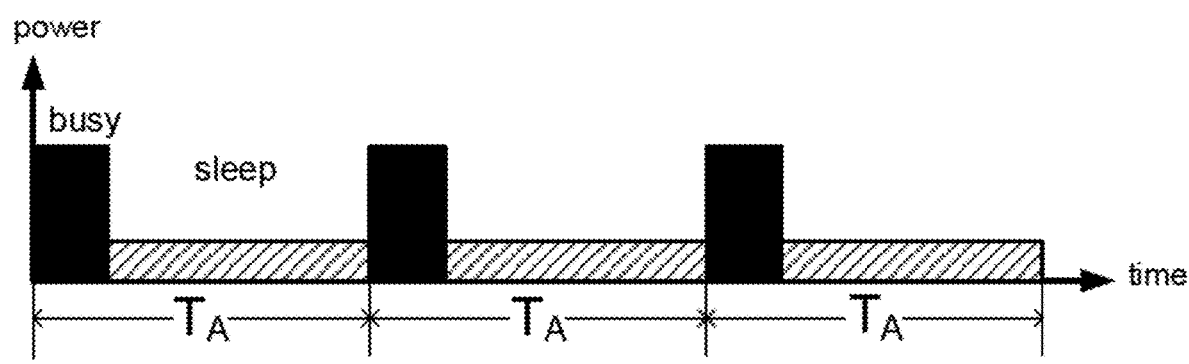
FIG. 1 is the view showing the power consumption on using the preferred embodiment according to the present invention.
Figure 2:
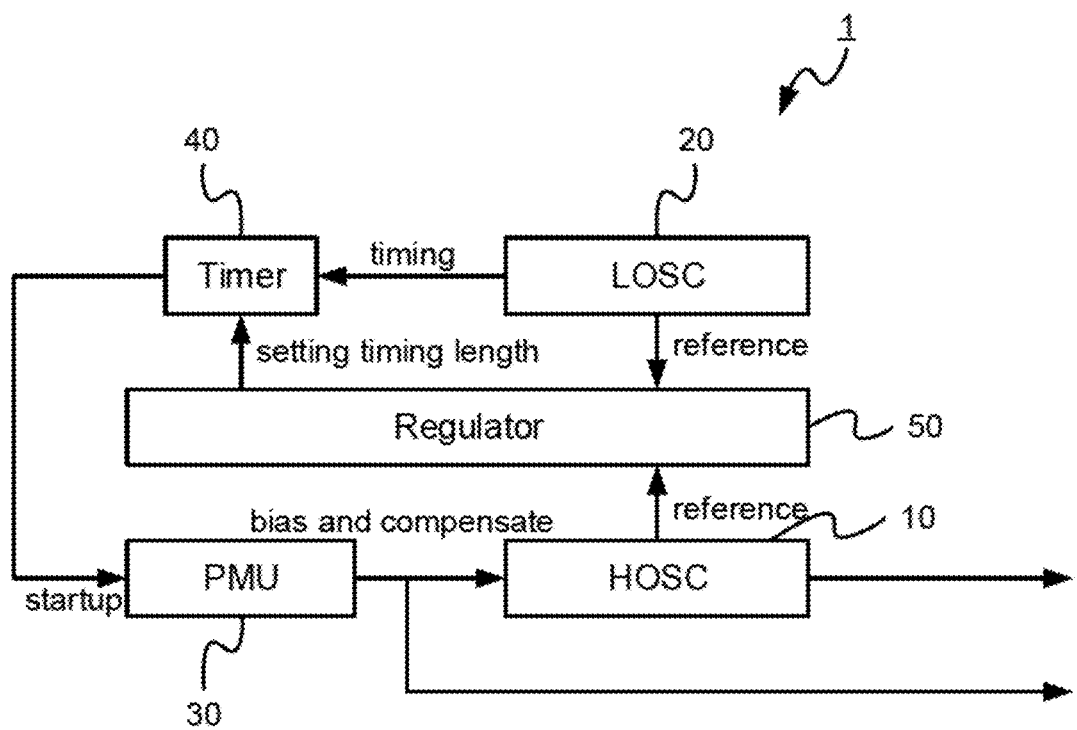
FIG. 2 is the structural view showing the preferred embodiment.

Please refer to FIG. 1 to FIG. 4, which are a view showing the power consumption on using a preferred embodiment according to the present invention; a structural view showing the preferred embodiment; a flow view showing the preferred embodiment; and a view showing the result of a state-of-use. As shown in the figure, the present invention is a low power operation method for an apparatus having a data transmission rate, which maintains stable and robust periods with lower power consumption, as shown in FIG. 1. The method according to the present invention is applied with a main apparatus 1, which comprises a first frequency oscillator (high-frequency oscillator, HOSC) 10, a second frequency oscillator (low-frequency oscillator, LOSC) 20, a power management unit (PMU) 30, a timer 40, and a regulator 50, as shown in FIG. 2.

The first frequency oscillator 10 is a high frequency oscillator compensated and biased by the PMU 30 to obtain high accuracy, high power, and robustness. During operating the PMU 30, a steady state is obtained without being influenced by voltage, process, and temperature.

The second frequency oscillator 20 is a low-frequency oscillator non-compensated. Because there is no compensation through PMU, low precision and low power is shown with a changing status formed as being easily influenced by voltage, process, and temperature.

The PMU 30 comprises a bandgap, a low dropout regulator (LDO), and a compensator, which, by being turned on by the timer 40, provides bias and compensation to the first frequency oscillator 10 according to voltage, process, and temperature.

The timer 40 processes timing by the second frequency oscillator 20 and sets a timing length by the regulator 50.

The regulator 50 sets the timing length of the timer 40 according to the frequency ratio of the first frequency oscillator 10 to the second frequency oscillator 20.

Figure 3:
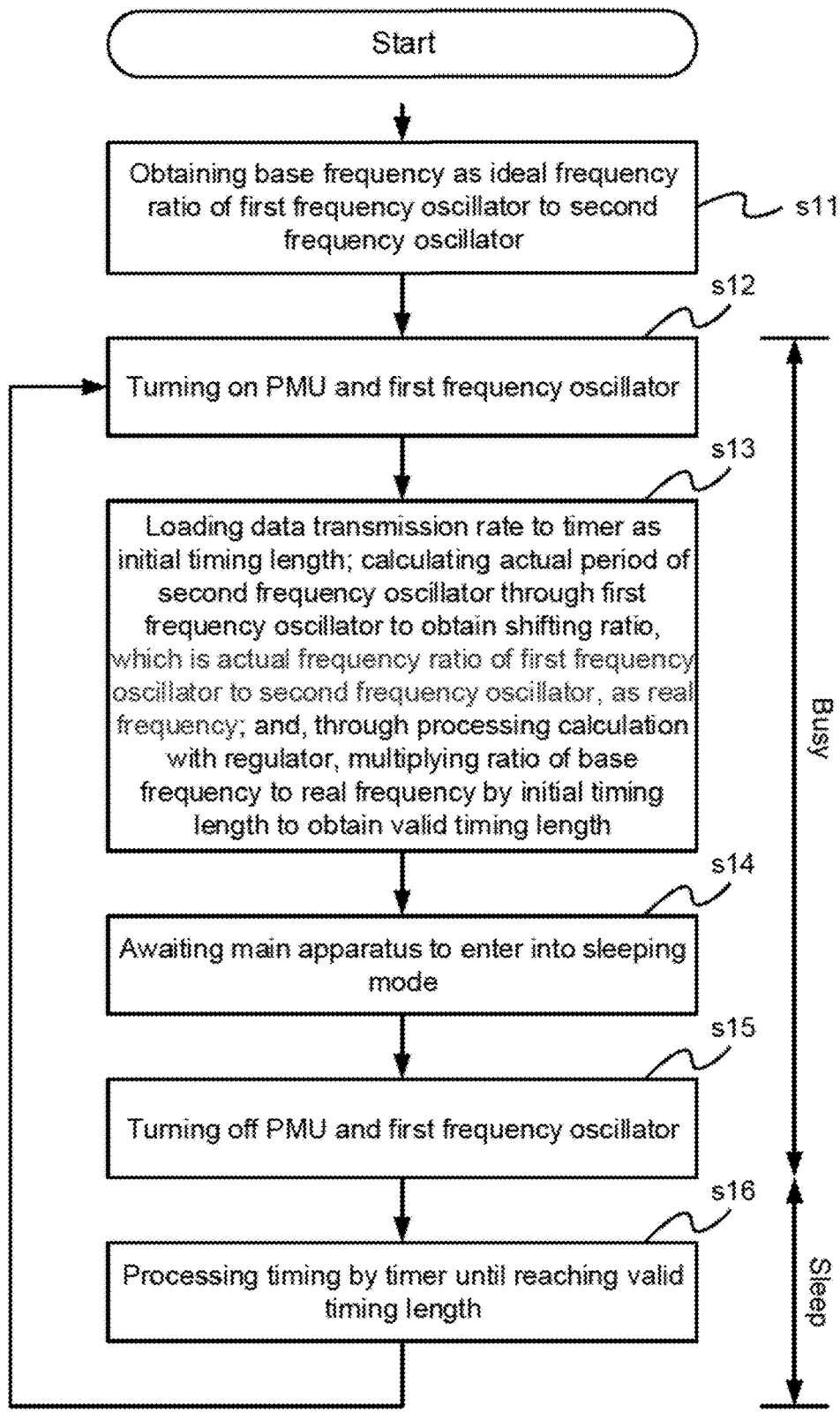
FIG. 3 is the flow view showing the preferred embodiment.

The present invention uses the main apparatus 1 to apply the method, whose flow view is shown in FIG. 3 and comprises the following steps:

(a) In step s11, the main apparatus 1 has a base frequency (Base), where the base frequency is a known constant and is a ratio of an ideal frequency of the first frequency oscillator 10 to an ideal frequency of the second frequency oscillator 20:

Base=ideal HOSC frequency/ideal LOSC frequency.

(b) In step s12, the PMU 30 and the first frequency oscillator 10 is turned on.

(c) In step s13, a data transmission rate (Data Rate), which is set by a user, is loaded to the timer 40 as an initial timing length (Initial):

Initial=Data Rate.

Then, in the regulator 50, an actual period of the second frequency oscillator 20 is calculated through the first frequency oscillator 10 to obtain an actual frequency ratio, which is shifting and a ratio of an actual frequency of the first frequency oscillator to an actual frequency of the second frequency oscillator, as a real frequency (Real):

Real=actual HOSC frequency/actual LOSC frequency.

At last, through processing calculation with the regulator 50, a ratio of the base frequency to the real frequency is multiplied by the initial timing length to obtain a valid timing length (Valid) of the timer 40:

Valid=Initial*Base/Real.

(d) In step s14, the main apparatus awaits to enter into a sleeping mode.

(e) In step s15, the PMU 30 and the first frequency oscillator 10 is turned off to save power.

(f) In step s16, after the timer 40 processes timing until reaching the valid timing length, step (b) is turned back for processing the next cycle of step (b) to step (f) continuously.

The main apparatus 1 is of a busy mode in step s12 to step s15 and is of the sleeping mode in step s16.

Thus, a novel low power operation method for an apparatus having a data transmission rate is obtained.

In the following, the first frequency oscillator 10 is noted as HOSC; the second frequency oscillator 20, LOSC; and the power management unit, PMU. On using the present invention, a base frequency, Base, is obtained as a known constant of frequency ratio. For example, an ideal output frequency of an HOSC is 10 mega-hertz (MHz); an ideal output frequency of a LOSC is 10 kilo-hertz (KHz); and, according to step s11, Base is a known constant:

Base=1000=10M/10K.

After turning on the HOSC and the PMU, a data transmission rate set by a user is loaded as an initial timing length of a timer. For example, a data transmission rate is assumed by the user to generate a data per 300 milliseconds (ms); the timer processes timing with a LOSC of a frequency of 10 KHz; and, for achieving the data transmission rate set by the user, according to step s13, the initial timing length loaded into the timer is:

Initial=3000 LOSC cycles.

A real frequency, Real, as a actual frequency ratio is obtained, which follows changes of voltage, process and temperature. For example, under a condition of a voltage of 3.8 volts (V) and a temperature of 85 Celsius degree (° C.), the actual output frequency of the HOSC is 10 MHz (where the HOSC is compensated by the PMU); the actual output frequency of the LOSC is 8 KHz (where the LOSC is without PMU); and, according to steps s13, Real is:

Real=1250=10M/8K.

Then, a valid timing length, Valid, of the timer is obtained through calculation with the regulator. For example, Base=1000; Real=1250; Initial=3000; and, according to steps s13, Valid is:

Valid=2400=3000*1000/1250.

Figure 4:
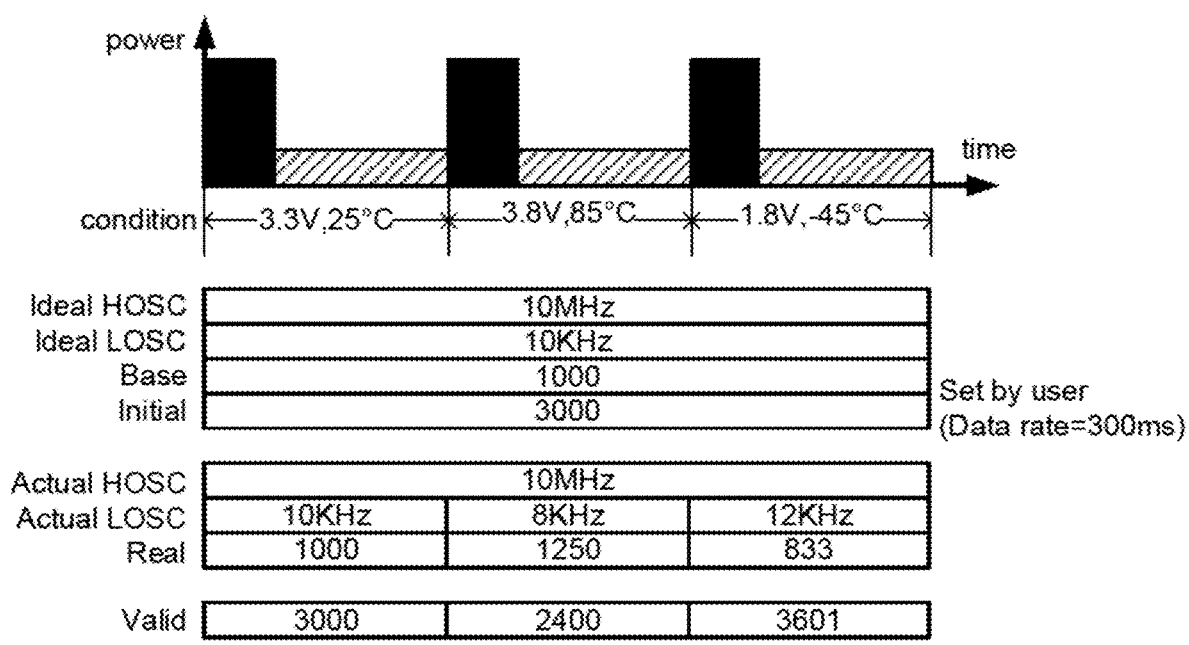
FIG. 4 is the view showing the result of the state-of-use.
Figure 5:
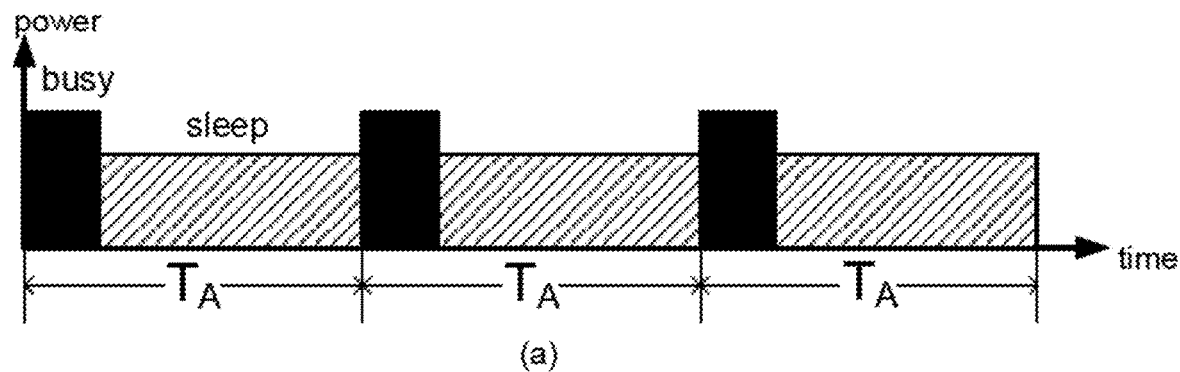
FIG. 5 is the view of the power consumption of the prior art.
Figure 5:
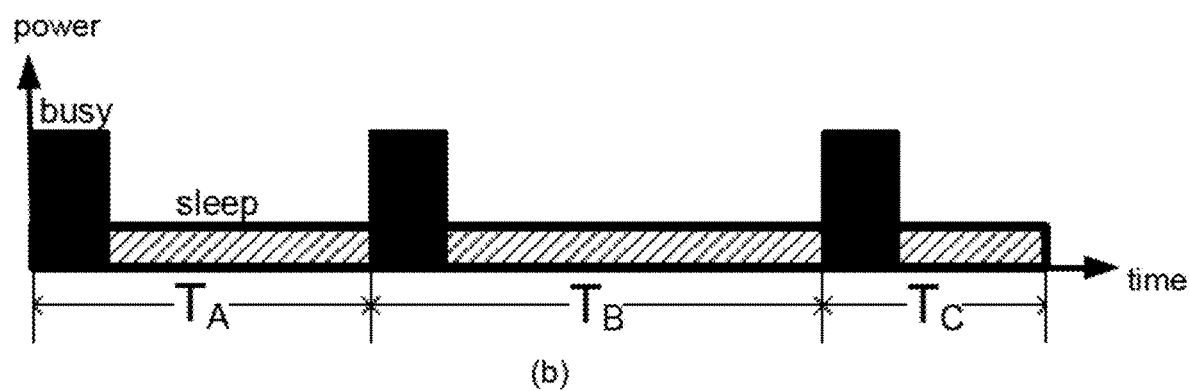

In a state-of-use shown in FIG. 4, as comparing to 3.3V and 25° C. used in the first cycle, 3.8V and 85° C. in the second cycle are obviously a high voltage and a high temperature for the HOSC; yet, because of being compensated by the PMU, 10 MHz is held. Even with changes to a low voltage of 1.8V and a low temperature of −45° C. in the next cycle, 10 MHz remains still. However, the non-compensated LOSC shifts to 8 KHz in the second cycle owing to the high voltage and the high temperature; and further shifts to 12 KHz in the third cycle for the low voltage and the low temperature. Thus, according to steps s13, Real and Valid are:

Real=833=10M/12K; and

Valid=3601=3000*1000/833.

The comprehensive summary of the three cycles is as follows: The data transmission rate is set accordingly by a user as 300 ms; and the initial timing length, Initial, of the timer as 3000. The ideal HOSC frequency is 10 MHz; the ideal LOSC frequency, 10 KHz; and the known base frequency, Base, 1000. The main apparatus runs the three cycles with the actual LOSC being changed by voltage and temperature to generate the real frequencies, Real, as 1000, 1250, and 833 separately. According to the changes of the actual LOSC in the state-of-use, the valid timing length, Valid, of the timer are respectively modified into 3000, 2400, and 3601 to maintain a constant period length. It proves that, by using the present invention, the main apparatus still maintains the data transmission rate set by the user even if the LOSC changes by the external factors.

As is described above, the present invention compensates the HOSC by the PMU to obtain a steady state without being influenced by voltage, process, and temperature. However, the LOSC is not compensated, so that a changing status influenced by voltage, process, and temperature. Accordingly, Base and Real are obtained to modify Initial of the timer to use the modified value as Valid of the timer. Valid obtained by the present invention is used to modify the timing length of the timer for generating periods, whose performance is the same as that of biasing and compensating the HOSC by the PMU; and said constant HOSC is generated for timing the whole period with the data transmission rate always stable and robust for each time. Besides, the periods obtained through modifying the timing length of the timer consume less power than that of timing the whole period by the PMU coordinated with the HOSC. Thus, the present invention uses a PMU coordinated with an HOSC for obtaining stableness and robustness. In an estimation way, the timing characteristic of robustness of the HOSC is transferred to a timing length of timer counted by another oscillator (e.g. LOSC). During sleeping, an apparatus maintains stable and robust periods via the modified timing length even if the HOSC and the PMU are closed. As a result, the periodic apparatus maintains data transmission rate with the low power consumption advantage of non-periodic apparatus.

To sum up, the present invention is a low power operation method for an apparatus having a data transmission rate, where a first frequency oscillator (HOSC) is biased by a PMU to obtain stableness and robustness; in an estimation way, the timing characteristic of robustness of the HOSC is transferred to a timing length of timer counted by another oscillator (e.g. LOSC); during sleeping, an apparatus maintains stable and robust periods via the modified timing length even if the HOSC and the PMU are closed; and, as a result, the periodic apparatus maintains data transmission rate with the low power consumption advantage of non-periodic apparatus.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A low power operation method for an apparatus having a data transmission rate,
    wherein the method is applied with a main apparatus, which comprises a first frequency oscillator (high-frequency oscillator, HOSC), a second frequency oscillator (low-frequency oscillator, LOSC), a power management unit (PMU), a timer, and a regulator; and
    wherein the method comprises steps of:
        (a) obtaining a base frequency of said main apparatus, wherein said base frequency is a known constant being a ratio of an ideal frequency of said first frequency oscillator to an ideal frequency of said second frequency oscillator;
        (b) turning on said PMU and said first frequency oscillator;
        (c) loading a data transmission rate, which is set by a user, to said timer as an initial timing length; then, in said regulator, calculating an actual period of said second frequency oscillator through said first frequency oscillator to obtain an actual frequency ratio, which is shifting, as a real frequency; and, at last, through processing calculation with said regulator, multiplying a ratio of said base frequency to said real frequency by said initial timing length to obtain a valid timing length of said timer;
        (d) awaiting said main apparatus to enter into a sleeping mode;
        (e) turning off said PMU and said first frequency oscillator; and,
        (f) after said timer processes timing until reaching said valid timing length, turning back to step (b) to process a next cycle of step (b) to step (f) continuously.

2. The method according to claim 1,
    wherein said first frequency oscillator is a high frequency oscillator compensated and biased by said PMU; and, during functioning said PMU, a steady state is obtained without being influenced by voltage, process, and temperature.

3. The method according to claim 1,
    wherein said second frequency oscillator is a low-frequency oscillator non-compensated and has a changing status influenced by voltage, process, and temperature.

4. The method according to claim 1,
    wherein, on turning on said PMU, comprising a bandgap, a low dropout regulator (LDO), and a compensator, by said timer, bias and compensation are processed to said first frequency oscillator according to voltage, process, and temperature.

5. The method according to claim 1,
    wherein, in step (c), said real frequency is a ratio of an actual frequency of said first frequency oscillator to an actual frequency of said second frequency oscillator.

6. The method according to claim 1,
    wherein, said main apparatus is of a busy mode in step (b) to step (e) and is of said sleeping mode in step (f).

* * * * *